US005847939A

United States Patent [19]

Cotton

[11] Patent Number: 5,847,939
[45] Date of Patent: Dec. 8, 1998

[54] SUPPORT MECHANISM FOR MOUNTING A CENTER BOLT LBOR AND THE LIKE

[75] Inventor: John F. Cotton, Jackson, Tenn.

[73] Assignee: ABB Power T&D Company Inc., Raleigh, N.C.

[21] Appl. No.: 899,557

[22] Filed: Jul. 24, 1997

Related U.S. Application Data

[63] Continuation of Ser. No. 472,381, Jun. 7, 1995.

[51] Int. Cl.[6] .................... H05K 7/14

[52] U.S. Cl. .................... 361/836; 361/647; 361/652; 361/673; 361/825; 200/11 TC; 335/202

[58] Field of Search .................... 361/809, 825, 361/836, 620, 623, 643, 647, 652, 673; 200/11 TC, 14, 17 R; 218/97, 99, 134, 137, 139; 335/202; 248/292.11, 635, 674

[56] References Cited

U.S. PATENT DOCUMENTS

| | | | |
|---|---|---|---|
| 3,316,367 | 4/1967 | Kowalski | 200/48 R |
| 3,571,534 | 3/1971 | Ashman | 200/14 |
| 3,590,183 | 6/1971 | Leonard | 200/441 |
| 3,624,319 | 11/1971 | Ristuccia | 200/11 TC |
| 3,992,595 | 11/1976 | Eley | 200/11 TC |
| 4,234,864 | 11/1980 | Johansson | 336/90 |
| 4,429,347 | 1/1984 | Seitz | 361/677 |
| 4,492,314 | 1/1985 | Avery | 220/646 |
| 4,532,386 | 7/1985 | Muench, Jr. et al. | 200/11 TC |
| 4,536,659 | 8/1985 | Seitz et al. | 307/41 |
| 4,554,420 | 11/1985 | Golub | 200/11 TC |
| 4,644,111 | 2/1987 | Hammond | 200/8 A |
| 4,963,696 | 10/1990 | Owen et al. | 174/50 |
| 5,021,615 | 6/1991 | Muench et al. | 200/11 TC |
| 5,045,655 | 9/1991 | Ludwig et al. | 361/809 |
| 5,483,032 | 1/1996 | Trayer et al. | 218/91 |

*Primary Examiner*—Lynn D. Feild
*Assistant Examiner*—John B. Vigushin
*Attorney, Agent, or Firm*—Woodcock Washburn Kurtz Mackiewicz & Norris LLP

[57] ABSTRACT

A center bolt LBOR switch 12 comprising a support ring 12-4 and a center bolt or threaded boss 12-2, and a nut 12-3 for securing the switch 12 to a transformer tank wall is disclosed. The disclosed invention allows a switch or other device to be mounted to the wall of a transformer tank without welding and without distorting the tank wall.

12 Claims, 3 Drawing Sheets

SUPPORT MECHANISM FOR MOUNTING A CENTER BOLT LBOR AND THE LIKE

This is a continuation of application Ser. No. 08/472,381, filed Jun. 7, 1995, the disclosure of which is herein incorporated by reference.

FIELD OF THE INVENTION

The present invention relates generally to devices for mounting switches and like mechanical loads to a supporting wall, e.g., a transformer tank wall. More particularly, the present invention relates to a center bolt "LBOR" with a supporting ring for mounting an LBOR switch to a pad mounted three-phase transformer tank.

BACKGROUND OF THE INVENTION

The present invention was made during the process of designing a support mechanism for attaching an LBOR switch to a transformer tank wall. One example of an LBOR switch is a manually-operated two-position load make or break oil-immersed switch. A problem with prior art support mechanisms is that such mechanisms require the welding of parts to the transformer tank wall. Prior to the present invention, it was necessary to weld two parts, i.e., the switch mechanism top frame and the operating shaft boss to the transformer tank wall, which is both process sensitive and labor intensive. To eliminate the need for welding, it is desirable to employ a center-bolted switch assembly. However, a center-bolted switch assembly would not produce an acceptable switch application because the weight of the switch and the weight and tension in the leads attached to the switch would cause severe distortion to the tank wall. The forces acting on the switch are described below in connection with the detailed description of one preferred embodiment of the present invention.

A major objective of the present invention is to provide a support mechanism for mounting loads, such as switches, to a transformer tank wall, which mechanism avoids distorting the tank structure.

SUMMARY OF THE INVENTION

According to the present invention, the above-identified goal is achieved, and the problems with the prior art are avoided, by employing a stabilizer or support ring, or the like, e.g., stabilizer legs, to spread the load over a much broader area of the tank wall, thus substantially reducing the forces tending to distort the transformer tank surface. The present invention can be employed to mount an LBOR switch, circuit breaker, tap charger, and/or dual voltage switch or the like, to a transformer tank wall. In one exemplary application of the invention, a center bolt LBOR switch is mounted on the wall of a transformer in a pad mounted three-phase distribution transformer.

DETAILED DESCRIPTION OF PREFERRED EMBODIMENTS

Figure 1:
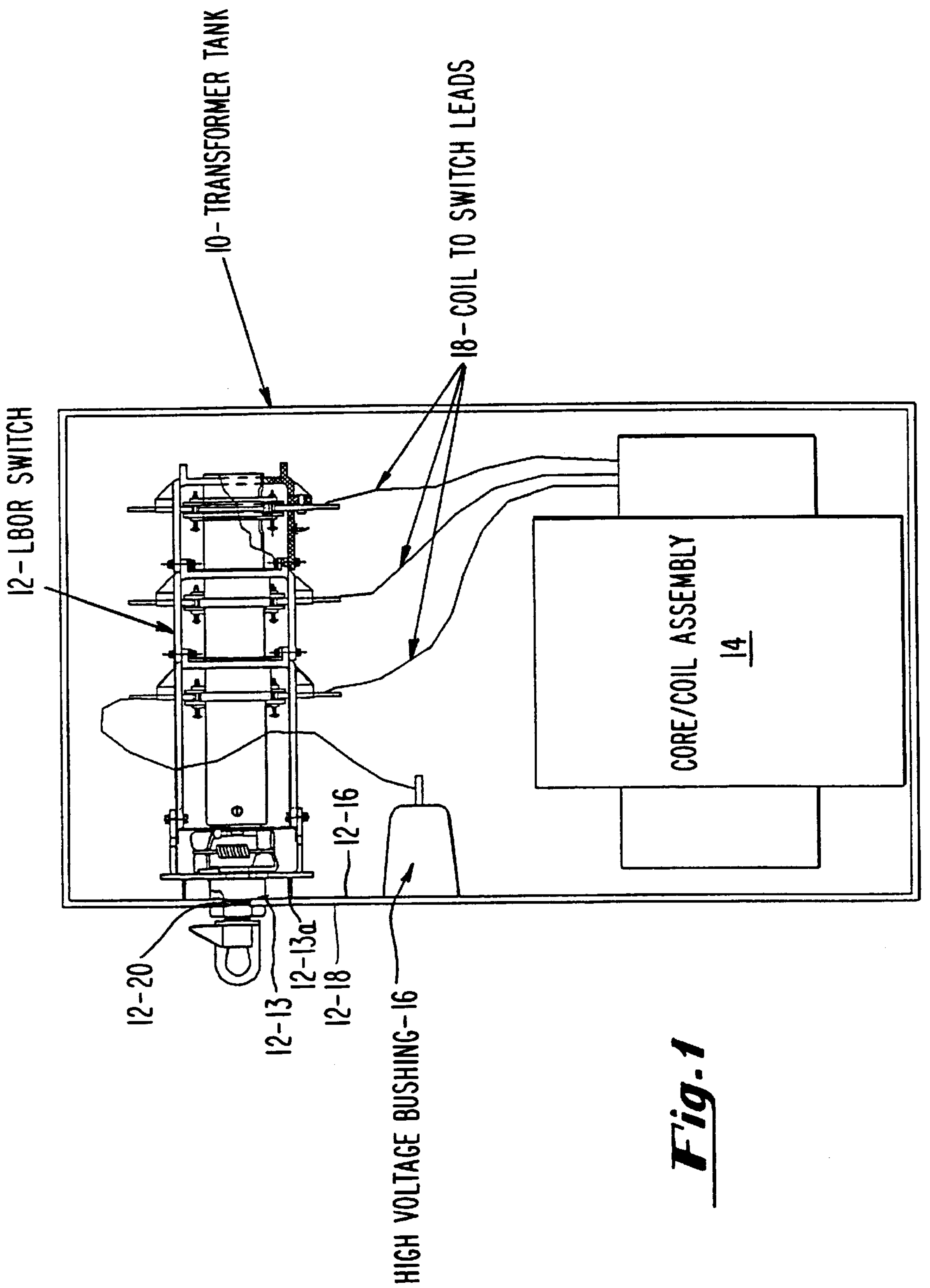
FIG. 1 depicts a side view of one preferred embodiment of the invention.

One preferred application of the present invention is in mounting an LBOR switch to a transformer tank. Referring to FIG. 1, a transformer tank 10 in combination with an LBOR switch 12 is shown. The switch 12 resides primarily within the tank 10, although the rotary handle portion of the switch is external to the tank. The switch 12 is connected to a transformer core/coil assembly 14 and a high voltage bushing 16 by leads 18.

Figure 2:
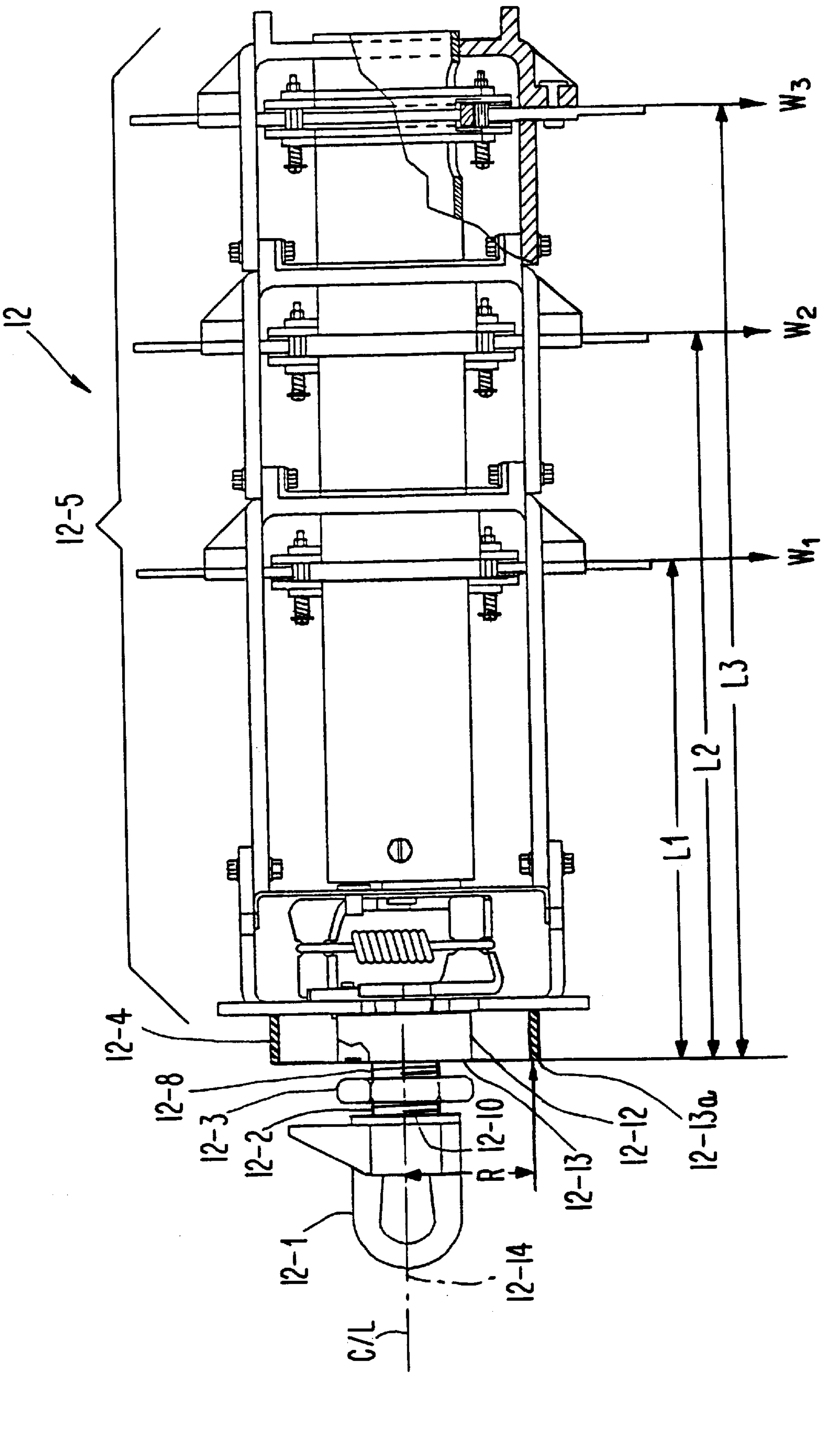
FIG. 2 depicts the center bolt LBOR switch of the present invention, including the support ring 12-4 and the forces (W and F) acting on the switch when it is mounted in a transformer.

The switch 12 is shown in greater detail in FIG. 2. As shown, the switch comprises a rotary dial 12-1, a center bolt (threaded boss) 12-2, a nut 12-3 for securing the switch to the transformer tank wall, a support ring 12-4, and other parts 12-5, which, in the context of the present invention, form a mechanical load on the transformer tank wall. Note that the transformer tank wall is not depicted in FIG. 2. However, the interface between the LBOR switch 12 and the transformer tank is clearly shown in FIG. 1. The center bolt 12-2 has a plurality of threads 12-8 disposed on its outer surface adjacent its end 12-10 and a hub 12-12 disposed at its opposite end. The hub 12-12 has a flat surface 12-13 perpendicular to the central axis 12-14 of the switch 12. The flat surface 12-13 of hub 12-12 is pulled tight to the side of transformer tank wall 12-16 when nut 12-3 is tightened against the opposite side 12-18 of the transformer tank wall. The annular support ring 12-4 is disposed in spaced apart surrounding relationship to the aperture 12-20 in the transformer tank wall and the center bolt 12-2; i.e., the threaded portion as well as the hub portion of the center bolt 12-2.

Referring to FIG. 2, the resultant forces acting down on the switch assembly 12 are represented by the vectors $W_1$, $W_2$, $W_3$. The force opposing the downward forces exerted by the weight of the switch and the coil leads is illustrated by the force vector F. The force vector F is substantially smaller than the force vector that would be required if it had to be provided by the mounting boss 12-2 and nut 12-3 by themselves. The force system acting on the switch 12 and the tank wall is generally defined by the following relationship:

$$F \times R = W_1 \times L_1 + W_2 \times L_2 + W_3 \times L_3$$

where the only variables not defined in FIG. 2 are the lengths $L_1$, $L_2$ and $L_3$. $L_1$ is the distance from the face or flat surface 12-13*a* of the support ring 12-4 which is in contact with the transformer tank wall side 12-16 (See FIG. 1) with $L_2$ being the distance to $W_2$ and $L_3$ being the distance to $W_3$. In the traditional switch mounting, support for the switch would be provided by the small hub 12-12 used to fasten the switch 12 to the transformer tank wall. This would yield a small "R" which, in turn, would generate a large "F". The support ring 12-4, in accordance to the invention, is much larger in diameter than the typical small hub 12-12 and therefore has a much larger "R" and would necessarily generate a much smaller "F" which, of course, is desirable. In addition, the value of "F" would be spread out over a much larger surface area of the transformer tank wall thereby reducing the switch loading on the transformer tank wall. In the specific design disclosed herein, the boss support surface is only 2 inches in diameter whereas the support ring diameter is 4 inches. This doubles the lever arm and cuts the resistive force in half. The support ring 12-4 also allows the resistive force to be spread over a much larger area of the tank wall. The support ring 12-4 provides this additional support capability without the need to weld additional parts of the tank wall. The transformer manufacturer simply inserts the switch boss through the tank wall and threads the attachment nut 12-3 onto the boss. There are no additional attachment procedures required. It will be apparent to those skilled in this art that the spreading of the force vector F over a larger area of the transformer tank wall prevents the wall from becoming distorted, which could occur if the support ring 12-4 were not present.

Figure 3:
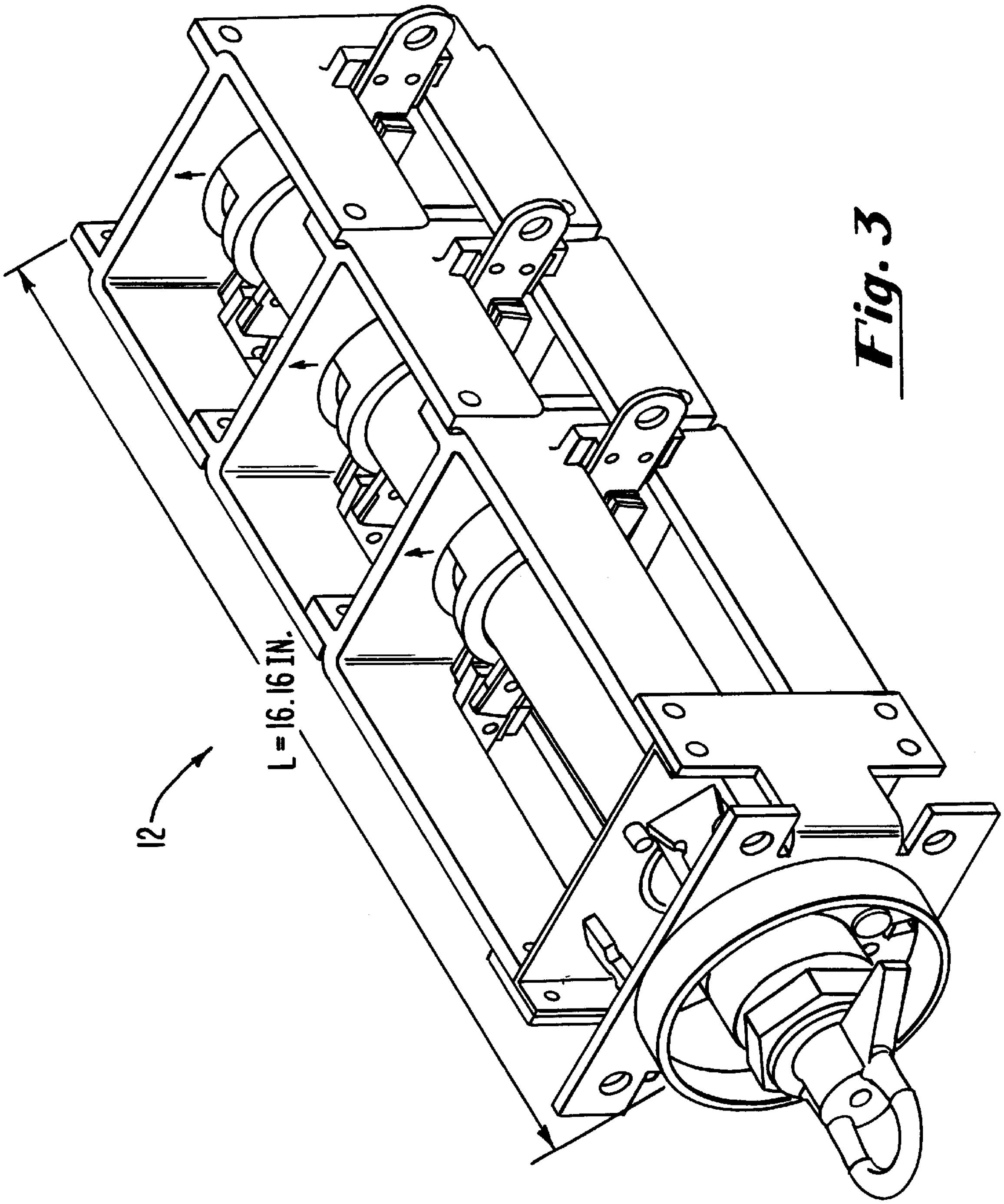
FIG. 3 depicts a perspective view of the LBOR switch 12.

FIG. 3 is a perspective view of the LBOR switch 12. In this illustrative embodiment, the overall length of the switch is 16.16 inches. Therefore, there is a significant cantilever effect which produces a large torque on the transformer tank wall. Without the support ring 12-4, this torque would distort the tank wall.

The present invention is not limited to the specific embodiment disclosed above. For example, instead of a ring structure of the type shown for the support ring, stabilizer legs distributed around the aperture through which the threaded boss 12-2 extends could be employed. Other modifications and variations of the preferred embodiments depicted herein will be recognized by those skilled in the art after reading this specification. Accordingly, the scope of protection of the following claims is intended not to be limited to the specific embodiments disclosed.

I claim:

1. A support mechanism for mounting a mechanical load to a transformer tank wall, comprising:

a. a mechanical load mounted to extend from a first side through an aperture in said tank wall to a second side, wherein a downward force (W) is exerted on said load at said second side of said wall, said load comprising a threaded boss with a portion thereof extending through the aperture in said tank wall;

b. a nut in threaded engagement with said threaded boss and securing said load to said tank wall; and, c. a support member coupled to said load and said second side of said wall, and disposed in spaced apart surrounding relationship to the aperture and the portion of said load extending through said tank wall;

whereby said downward force (W) is balanced by a force (F) acting through said support member.

2. A support mechanism as recited in claim 1, wherein said load comprises a switch.

3. A support mechanism as recited in claim 2, wherein said switch comprises an LBOR switch.

4. A support mechanism as recited in claim 1, wherein said load comprises a member of the group including: an LBOR switch, a circuit breaker, a tap changer, a dual voltage switch.

5. Transformer apparatus comprising:

a. a transformer tank having a wall;

b. a transformer core/coil assembly mounted within said transformer tank;

c. a mechanical load mounted to extend from a first side through an aperture in said tank wall to a second side, wherein a downward force (W) is exerted on said load at said second side of said wall, said load comprising a threaded boss with a portion thereof extending through the aperture in said tank wall;

d. a nut in threaded engagement with said threaded boss and securing said load to said tank wall; and, e. a support member coupled to said load and said second side of said wall, and disposed in spaced apart relationship to the aperture and the portion of said load extending through said tank wall;

whereby said downward force (W) is balanced by a force (F) acting through said support member.

6. Transformer apparatus according to claim 5, wherein said load comprises a switch.

7. Transformer apparatus according to claim 6, wherein said switch comprises an LBOR switch.

8. Transformer apparatus according to claim 5, wherein said load comprises a member of the group including: an LBOR switch, a circuit breaker, a tap changer, a dual voltage switch.

9. Transformer apparatus comprising:

a. a transformer tank having a wall;

b. a transformer core/coil assembly mounted within said transformer tank;

c. a switch operatively connected to said core/coil assembly and mounted to extend from a first side through an aperture in said tank wall to a second side, wherein a downward force (W) is exerted on said switch at said second side of said wall, said switch comprising a threaded boss with a portion thereof extending through the aperture in said tank wall;

d. a nut in threaded engagement with said threaded boss and securing said switch to said tank wall; and, e. a support member coupled to said switch and said second side of said wall, and disposed in spaced apart relationship to the aperture and the portion of said switch extending through said tank wall;

whereby said downward force (W) is balanced by a force (F) acting through said support member.

10. Transformer apparatus according to claim 9, wherein said support member is an annular support ring disposed in surrounding relationship to the aperture and the portion of said load extending through said tank wall.

11. Transformer apparatus according to claim 10, wherein said switch comprises an LBOR switch.

12. Transformer apparatus according to claim 11, and further including a bushing, said bushing being operatively connected to said LBOR switch.

* * * * *